(12) United States Patent
Betti-Berutto et al.

(10) Patent No.: US 6,794,934 B2
(45) Date of Patent: Sep. 21, 2004

(54) HIGH GAIN WIDEBAND DRIVER AMPLIFIER

(75) Inventors: Andrea Betti-Berutto, Menlo Park, CA (US); Stefano D'Agostino, Menlo Park, CA (US)

(73) Assignee: iTerra Communications, LLC, Fremont, CA (US)

( * ) Notice: Subject to any disclaimer, the term of this patent is extended or adjusted under 35 U.S.C. 154(b) by 0 days.

(21) Appl. No.: 10/022,012

(22) Filed: Dec. 14, 2001

(65) Prior Publication Data

US 2003/0112075 A1 Jun. 19, 2003

(51) Int. Cl.⁷ ............................. H03F 3/68; H03F 3/60; H03F 3/45
(52) U.S. Cl. ................... 330/124 R; 330/54; 330/69
(58) Field of Search ........................ 330/53, 54, 69, 330/84, 124 R, 253, 286, 295, 301, 308

(56) References Cited

U.S. PATENT DOCUMENTS

| | | | |
|---|---|---|---|
| 4,495,429 A | | 1/1985 | Oda et al. |
| 4,598,256 A | | 7/1986 | Kinkel |
| 4,668,920 A | * | 5/1987 | Jones ......................... 330/286 |
| 4,963,835 A | * | 10/1990 | Saitoh ........................ 330/253 |
| 5,070,304 A | * | 12/1991 | Salib et al. ............. 330/295 X |
| 5,166,635 A | * | 11/1992 | Shih ........................... 330/253 |
| 5,357,209 A | | 10/1994 | Mader et al. |
| 5,365,197 A | | 11/1994 | Ikalainen |
| 5,550,513 A | | 8/1996 | Wong |
| 5,880,640 A | | 3/1999 | Dueme |
| 5,936,462 A | | 8/1999 | Muraishi |
| 6,097,250 A | * | 8/2000 | Kamali et al. .......... 330/301 X |

OTHER PUBLICATIONS

R. Schmid et al., *40Gbit/s EAM driver IC in SiGe bipolar technology*, Electronics Letters May 28, 1998, vol. 34, No. 11.

R. Schmid et al., *SiGe Driver Circuit with High Output Amplitude Operating up to 23 Gb/s*, IEEE Journal of Solid–State Circuits, vol. 34, No. 6, Jun. 1999.

J. Godin et al., *40 Gbit/s Optical Communications: InP DHBT technology, circuits and system experiements*, IEEE, 1999.

M. Leich et al., *40 Gbit/s high voltage modulator driver in P–HEMT technology*, Electronics Letters, Oct. 14, 1999, vol. 35, No. 21.

Z. Lao et al., *DC 30 GHz bandwidth and 36 db gain limiting amplifier for 40 Gbit/s optical transmission systems*, Electronis Letters, Dec. 4, 1997, vol. 33, No. 25.

Zhihao Lao et al., *40–Gb/s High–Power Modulator Driver IC for Lightwave Communication Systems*, IEEE Journal of Solid–State Cicuits, vol. 33, No. 10, Oct. 10, 1998.

J. Godin et al., *Design of Decision and Driver Circuits for 40 Gbit/s Data Rate Optical Communication*, OPTO+, Groupement d'Intérêt Économique, Marcoussis, France (*France Telecom R&D) jean.godin@optoplis.fr.

Mounir Meghelli et al., *High Power and High Speed InP DHBT Driver IC's for Laser Modulation*, IEEE Journal of Solid–State Circuits, vol. 33, No. 9, Sep. 1998.

A. Thiam et al., *40 Gbit/s GaAs P–HEMT driver module for optical communications*, Electronics Letters, Nov. 12, 1998, vol. 34, No. 23.

* cited by examiner

*Primary Examiner*—Steven J. Mottola
(74) *Attorney, Agent, or Firm*—Townsend and Townsend and Crew LLP; Babak S. Sani

(57) ABSTRACT

Methods and circuitry for implementing monolithic high gain wideband amplifiers. The invention implements an amplifier with a limiter that also performs a signal dividing function. In a specific embodiment, the limiter is designed to make available two in-phase outputs that are then used to drive two gate input lines of a combiner distributed amplifier.

24 Claims, 4 Drawing Sheets

US 6,794,934 B2

HIGH GAIN WIDEBAND DRIVER AMPLIFIER

BACKGROUND OF THE INVENTION

The present invention relates in general to high speed integrated circuitry, and in particular to methods and circuitry for implementing high gain driver amplifiers having very large bandwidth of the type used in optical communication systems.

The coming of the modern information age has brought about phenomenal growth in demand for telecommunications-based services and products, driven primarily by the Internet. As the burgeoning expansion of the Internet continues along an unprecedented and unpredictable path, many new applications are foreseen and expected. These applications are placing increasing demands for ultra-high speed circuit solutions that maximize integration while minimizing power consumption among other requirements. In parallel, driven by the explosive growth in bandwidth requirements of multimedia applications, various ultra-high bit rate transmission techniques have been developed. Fiber-optic communications system speeds have increased from asynchronous-transfer-mode (ATM) rates of 155 Mb/s and synchronous optical network (SONET) rates of 622 Mb/s to the optical carrier (OC) standard of OC-192 at 10 Gb/s and OC-768 at 40 Gb/s.

Recent advances in optical and semiconductor processing technologies are enabling 40 Gb/s systems to move from research laboratories to production ready systems that can be manufactured in large volumes. However, the design of various functional blocks, especially at the interface with the fiber, remains a challenging task. For example, one of the most critical circuits in an optical transmitter is the amplifier in the optical modulator that drives the fiber. At the 40 Gb/s rate, the amplifier must exhibit very large bandwidth. It is also required to drive a relatively large signal (e.g., >7Vpp). The large bandwidth required smaller and faster transistors while the higher voltage operation requires the opposite. The driver amplifier is also required to perform a limiting function to achieve stable eye diagram at its output. These various and competing requirements create a set of tradeoffs that make the task of designing the amplifier a particularly difficult one.

Current approaches to designing the driver amplifier are based on a distributed amplifier architecture. This type of an amplifier connects a number of parallel amplifier cells that are typically made up of a single transistor or a cascoded pair of transistors. The limiting function is achieved by making the amplifier work in deep saturation. The power compression in this design, however, causes about 3–4 dB of gain loss, requiring more cells to achieve the desired overall gain or several cascaded devices. A larger number of amplifiers cells, however, results in lower bandwidth and increased power consumption. An alternative approach separates the limiting function from the amplifier by using a limiter circuit that drives one or more distributed amplifiers such that the amplifier need not operate in saturation region. There are drawbacks to this approach as well. At 40 Gb/s, most of the circuitry is implemented in a single-ended architecture and as such, the addition of a single-ended limiter reduces the overall achievable gain, while the power levels remain as another constraint.

An improvement has been offered by an implementation that combines two distributed amplifiers in parallel to obtain an additional 3 dB of voltage gain and a higher output voltage. The combined amplifier thus includes two input gate lines and a common high current drain line. To drive the two input gate lines, a divider (or splitter) preamplifier is used which receives the single-ended output of the limiter and produces two output signals that drive the two input gate lines of the final amplifier which is commonly referred to as the combiner amplifier. While this approach has provided improvements in the power versus bandwidth tradeoff, it has added more circuitry and still requires a single-ended limiter. Additionally, this solution requires a large DC level shift (from about 8V down to near 0V) between the output of the divider preamplifier and the combiner amplifier. This level shift typically requires large passive elements such as resistors or capacitors that are too large to be integrated on the same chip as the amplifier and add to the power consumption of the device.

There is therefore a need for improved methods and circuitry for implementing high gain wideband amplifiers.

BRIEF SUMMARY OF THE INVENTION

The present invention provides methods and circuitry for implementing monolithic high gain wideband amplifiers. Broadly, the invention implements an amplifier with a limiter that also performs the divider function. In a specific embodiment, the limiter is designed to make available two in-phase outputs that are then used to drive the two gate input lines of a combiner distributed amplifier. The resulting amplifier essentially eliminates the divider distributed preamplifier of the prior art while achieving the desired bandwidth, gain and power. The limiter/divider of the invention also reduces the level shifting task to small enough levels to eliminate the need for large capacitors or resistors allowing a higher level of integration.

Accordingly, in one embodiment, the present invention provides an amplifier circuit including a limiter preamplifier having a differential amplifier coupled to receive a differential signal at its inputs and configured to generate a differential output signal made up of a first output signal and a second output signal, and an output stage having a first differential output amplifier coupled to the first output signal and a second differential output amplifier coupled to the second output signal; and a combiner distributed amplifier having a first input coupled to an output of the first differential output amplifier, and a second input coupled to an output of the second differential output amplifier, wherein the output of the first differential output amplifier and the output of the second differential output amplifier are of the same phase.

In another embodiment, the present invention provides a method of amplifying a high frequency signal including receiving a differential signal at differential inputs of a limiter circuit; performing a limiting function on the differential signal; using the limiter circuit to generate a pair of in-phase output signals; and applying, respectively, the pair of in-phase output signals to a pair of input terminals of a combiner distributed amplifier.

In yet another embodiment, the present invention provides a limiter amplifier having a differential amplifier cell coupled to receive a differential signal at its inputs and configured to generate a differential output signal made up of a first signal and a second signal; and an output stage having a first differential output amplifier coupled to the first signal and a second differential output amplifier coupled to the second signal, wherein the first differential output amplifier is configured to generate a first single-ended output signal and the second differential output amplifier is configured to generate a second single-ended output signal that is in phase with the first single-ended output signal.

The following detailed description and the accompanying drawings will provide a better understanding of the nature and advantages of the driver amplifier of the present invention.

BRIEF DESCRIPTION OF THE DRAWINGS

In the various figures, the same reference numerals are used to designate the same elements.

DETAILED DESCRIPTION OF THE INVENTION

Figure 1:
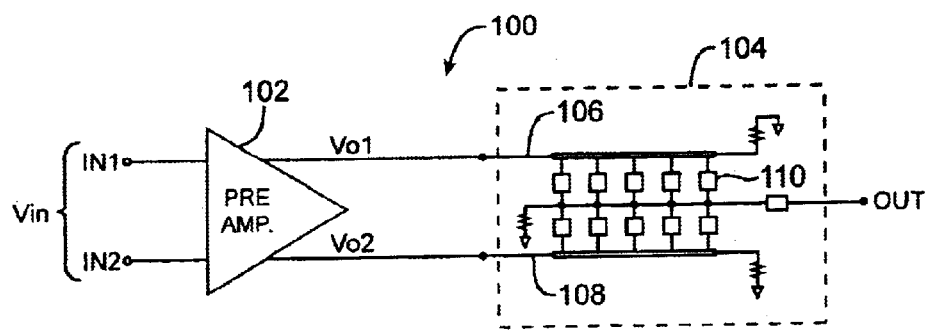
FIG. 1 is a simplified block diagram of a wideband amplifier according to one embodiment of the present invention.

A simplifier block diagram of a wideband amplifier 100 according to one embodiment of the invention is shown in FIG. 1. Amplifier 100 includes a preamplifier 102 that receives a differential input signal Vin at its inputs IN1 and IN2. Preamplifier 102 acts as a limiter as well as a divider to produce a pair of limited output signals Vo1 and Vo2 that are in phase with respect to each other. Signals Vo1 and Vo2 are respectively applied to two input gate lines 106 and 108 of a combiner distributed amplifier 104. The output OUT of combiner distributed amplifier 104 provides the final output of amplifier 100. Distributed amplifier 104 is shown as having five amplifier cells 110 in each of its halves. It is to be understood, however, that this is for illustrative purposes only and that the number of amplifier cells varies depending on the desired gain and other requirements of a given application. Implementations for distributed amplifier 104 will be described further below in greater detail in connection with FIGS. 4A and 4B.

Figure 2:
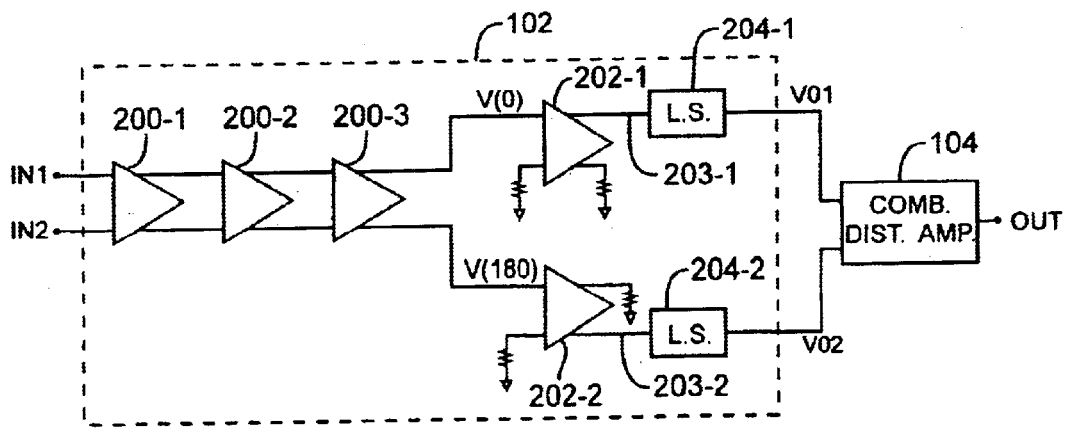
FIG. 2 is a block diagram of limiter/divider preamplifier according to an exemplary embodiment of the present invention.

Unlike prior art implementations that require a limiter amplifier that would then be followed by a divider (or splitter) distributed amplifier, the present invention has developed a circuit technique that allows for combining the signal limiting and the signal splitting functions into one circuit, preamplifier 102. Referring to FIG. 2, there is shown a block diagram of an exemplary implementation for preamplifier 102. This embodiment includes a number of differential limiting amplifiers 200, in this example three, that are serially connected as shown. The number of differential amplifiers 200 depends on the desired gain as well as the process technology among other factors. The differential output of the final amplifier 200-3 includes a pair of signals V(0) and V(180) that are 180 degrees out of phase with respect to each other. Signals V(0) and V(180) are respectively applied to an input of differential amplifiers 202-1 and 202-2. By tapping the appropriate output leg of the differential output of each of amplifiers 202-1 and 202-2, two signals that are in phase with respect to each other are provided at nodes 203-1 and 203-2. The splitting of the signal is thus achieved using the limiting amplifiers. The in-phase signals on nodes 203-1 and 203-2 are then level shifted by level shift circuits 204-1 and 204-2, respectively, to generate output signal Vo1 and Vo2 that drive the inputs of combiner distributed amplifier 104.

Figure 3:
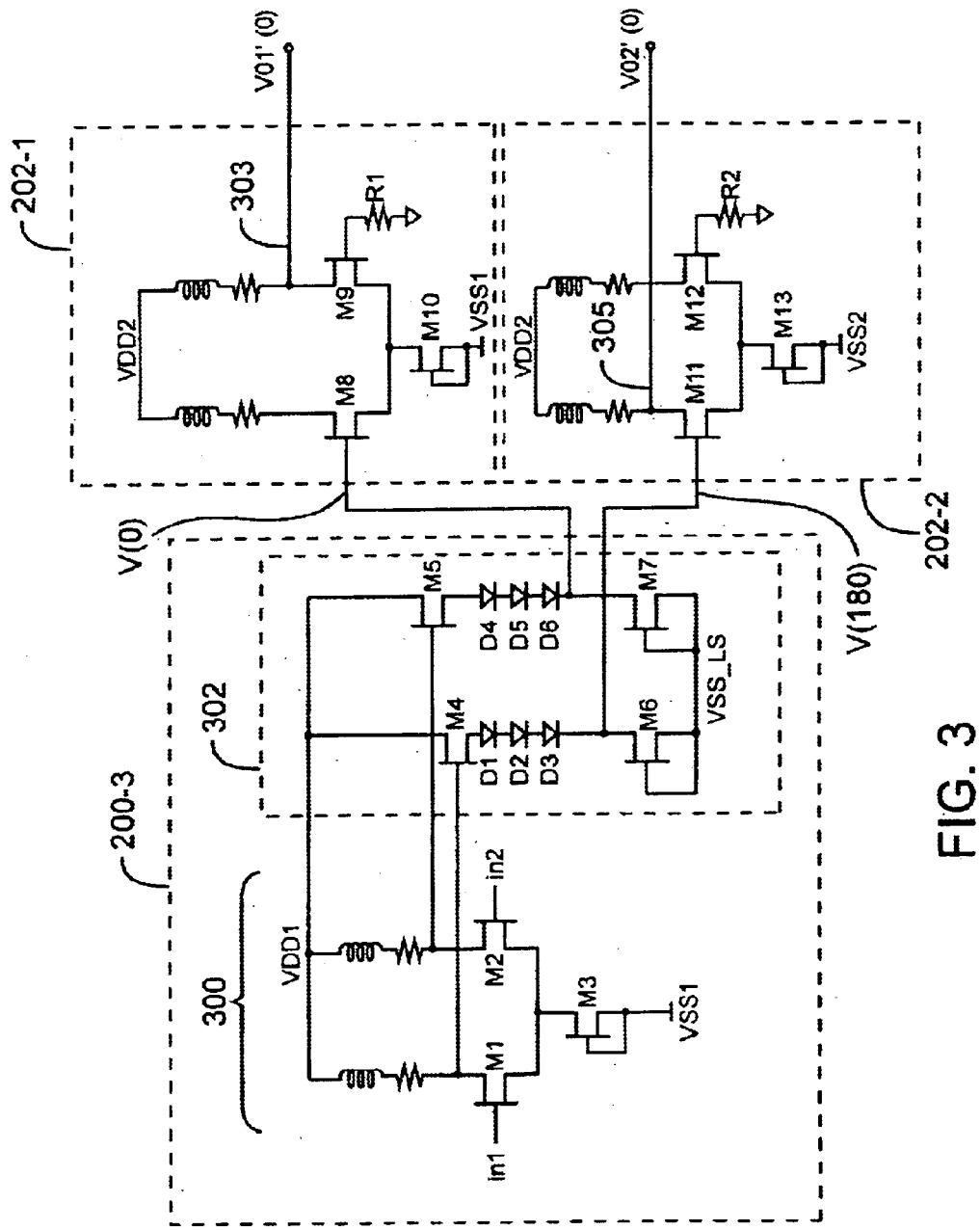
FIG. 3 is a partial schematic of an exemplary circuit implementation for the limiter/divider preamplifier of the present invention.

FIG. 3 shows an exemplary circuit implementation for a section of preamplifier 102 including differential limiter amplifier 200-3 and amplifiers 202-1 and 202-2. Differential limiting amplifier 200-3 includes a differential pair input stage 300 that is followed by a level shifting buffer 302. Differential pair input stage 300 includes input transistors M1 and M2 that are coupled to the positive power supply VDD1 through respective series RL loads, and a current source transistor M3 that connects the common-source node of the pair to the negative power supply VSS1. Differential pair input stage 300 provides the desired gain for amplifier 200-3. The outputs of gain stage 300 are connected to buffer 302. Buffer 302 includes source-follower transistors M4 and M5, each of which has a series of diodes (D1, D2, D3 for M4 and D4, D5, D6 for M5) connected at its source. The diodes are coupled to level shifted negative power supply VSS_LS as shown. Buffer 302 provides level shifting and impedance transformation to optimize the interface with the next stage. The 180 degrees out of phase outputs V(0) and V(180) of buffer 302 each respectively connects to one input of a differential pair amplifiers 202-1 and 202-2. The other inputs of amplifiers 202-1 and 202-2 are resistively terminated by resistors R1 and R2, respectively. These resistors may have values of, for example, 50 ohms. Differential amplifiers 202-1 and 202-2 are similar in their construction to differential amplifier 300, except that they operate with level shifted supply voltages VDD2 and VSS2. To obtain a pair of in-phase signals, the non-inverting output (node 303) of differential pair 202-1 is tapped as its output, while the inverting output (node 305) of differential pair 202-2 is tapped as its output. The pair of in-phase output signals Vo1'(0) and Vo2'(0) are level shifted before being applied to combiner distributed amplifier 104.

It is to be understood that the specific transistor level implementation shown in FIG. 3 is simplified and is for illustrative purposes only. Other variations and modification are possible. For example, the symbols used for the transistors indicate a process that uses GaAs field effect transistor technology. However, the invention is not limited to a specific process technology, and other technologies including, for example, AlGaAs/InGaAs high electron mobility transistor (HEMT), SiGe, silicon bipolar, InP or AlGaAs/GaAs heterojunction bipolar transistor (HBT) technologies and the like may also be used to implement the circuitry. Also, diodes D1 through D6 may be implemented in various ways including, for example, transistors operating as diodes. In another variation, the RL load for the untapped output leg in each of differential pairs 202-1 and 202-2, may be removed such that the drain terminals of transistors M8 and M12 connect to VDD2 directly. This results in a smaller amplifier cell and eliminates the miller capacitance effect which improves the bandwidth of the amplifier. Furthermore, to obtain in-phase output signals, the outputs Vo1'(0) and Vo2'(0) need not necessarily be tapped directly off of an output branch of its respective differential pair. Alternative embodiments may include other inverting buffers coupled to the outputs of differential pairs 202-1 or 202-2.

By thus combining the limiting and signal splitting functions into one circuit, the invention eliminates the need for separate limiter and divider circuitry. This results in a number of advantages. One advantage is the significant reduction in circuit overhead and power consumption. Another advantage is the reduction in the amount of required DC level shifting that needs to occur before applying the signal to the combiner distributed amplifier. In one application, the signal at the input of the combiner distributed amplifier is required to be around 0V. The prior art divider distributed amplifier required a signal as large as, for example, 8V. The interface between the divider distributed amplifier and the combiner distributed amplifier, therefore, required a relatively large DC level shift (8V to 0V). This necessitated the use of large passive elements such as capacitors or resistors to achieve the shift in the DC voltage level. The limiter/divider preamplifier of the present invention, on the other hand, operates with a signal in the range of, for example, 2V. This makes the task of DC level shifting much easier allowing, for example, a few diodes to achieve the desired level shift. Referring back to FIG. 2, level shift blocks 204-1 and 204-2 may thus be implemented by a number, for example three, serially-connected diodes, similar to diodes D1, D2 and D3 (or D4, D5 and D6) in FIG. 3.

Figure 4A:
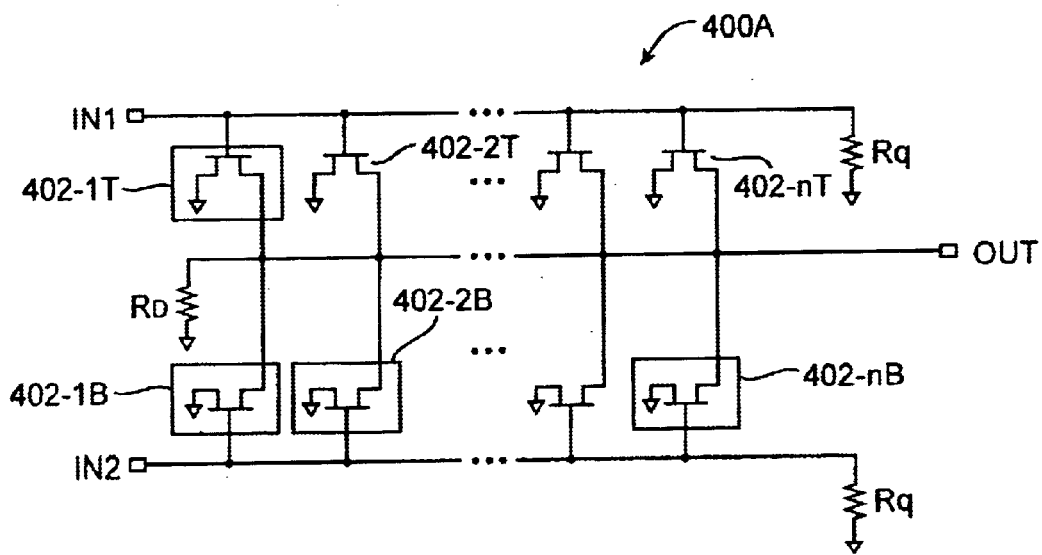
FIGS. 4A and 4B show exemplary distributed combiner amplifiers for use in the wideband driver amplifier of the present invention.
Figure 4B:
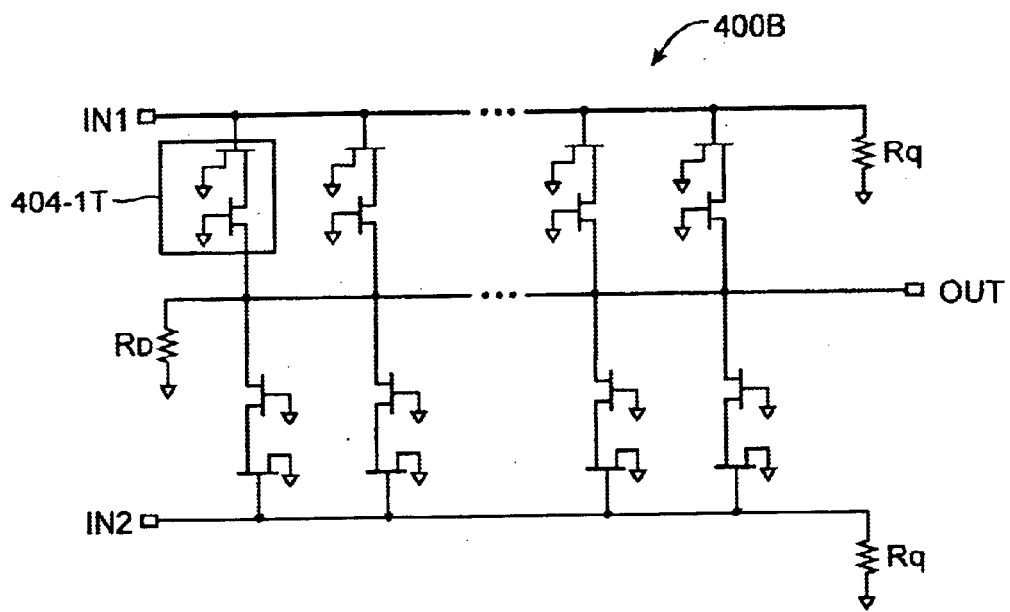

FIGS. 4A and 4B show exemplary combiner distributed amplifiers 400A and 400B for use in the wideband driver amplifier of the present invention. Distributed combiner amplifier 400A uses common-source single-transistor amplifier cells 402 while distributed combiner amplifier 400B uses amplifier cells 404 each of which is made up of a pair of cascoded transistors. The cascoded amplifier cell enlarges the overall size but increases the bandwidth of the distributed amplifier. The in-phase signals IN1 and IN2 drive the gate terminals of amplifier cells in the top half and the bottom half of the combiner distributed amplifier, respectively. It is to be understood that the two simplified implementations for the combiner distributed amplifier are provided for illustrative purposes only, and that other variations and modifications are possible.

Figure 5:
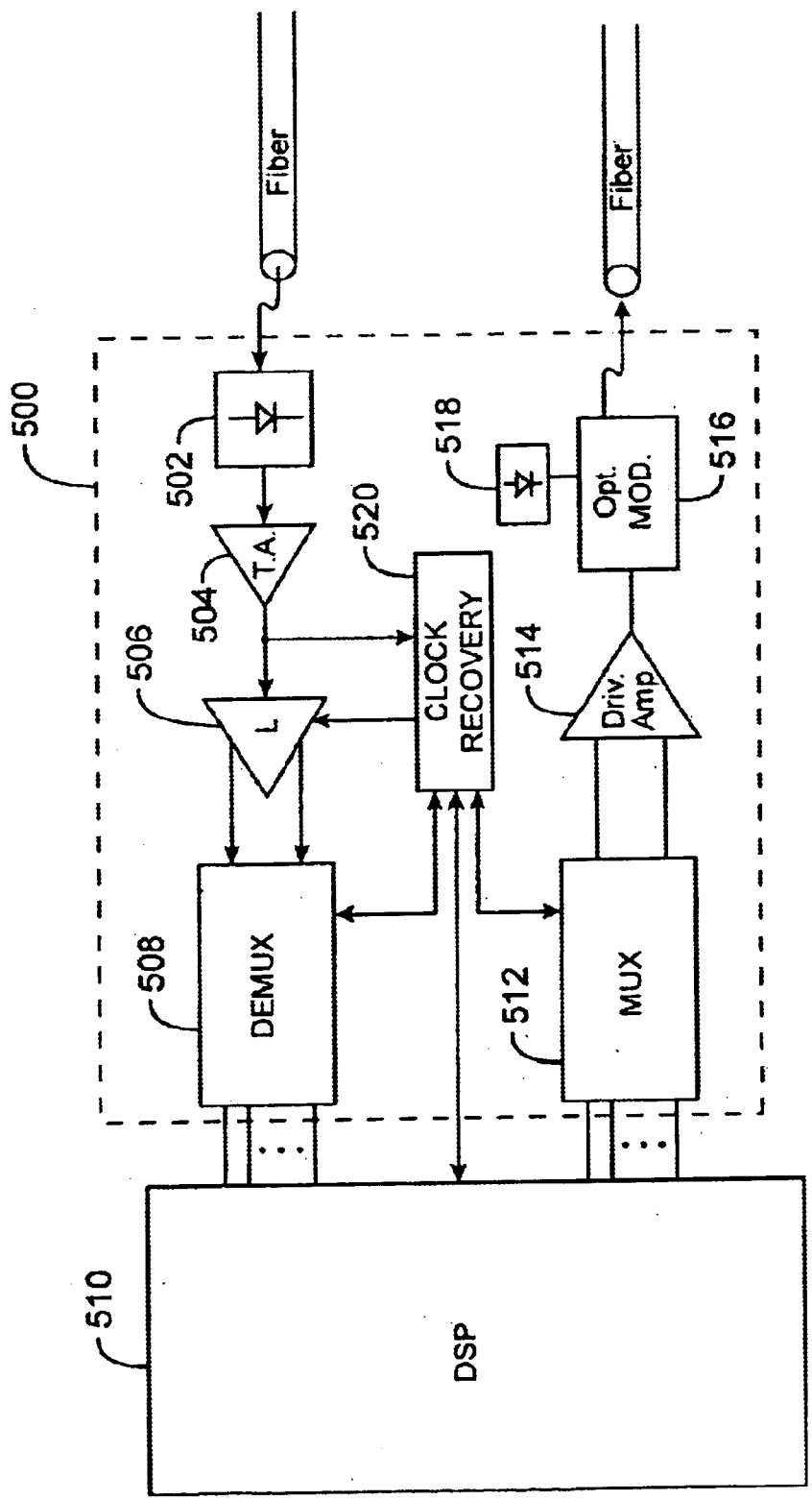
FIG. 5 is a block diagram of a high frequency data communication system employing the wideband driver amplifier according to the present invention.

In another embodiment, the present invention provides an ultra-high bit rate communication system enabled by the wideband amplifier of the type shown in FIG. 1. FIG. 5 is a block diagram of the transmitter/receiver section 500 of a fiber optic communication system implementing, for example, the OC-192(10 Gb/s) or the OC-768(40 Gb/s) standards. At the receive side, a photo diode 502 receives the optical signal and converts it into an electrical signal. A trans-impedance amplifier TA 504 amplifies the receive signal and applies it to a limiter (or decision circuit) 506. Limiter 506 supplies its differential output to a demultiplexing circuit DEMUX 508. A clock recovery (CR) circuit 520 extracts a clock signal from the receive signal and supplies it to various blocks in transmitter/receiver 500. DEMUX 508 performs a serial to parallel conversion that converts a serial receive signal having a high frequency, e.g., 40 Gb/s, to multiple (e.g., 16) parallel lower frequency signals at, e.g., 2.5 Gb/s. The lower frequency signal is then supplied to a digital signal processing block DSP 510 for further processing. On the transmit side, a multiplexing circuit MUX 512 receives a multiple parallel lower frequency transmit signals at its input and converts them into a serial differential signal having higher frequency. A driver amplifier 514 amplifies the high frequency signal and applies it to an optical modulator 516. Optical modulator 516 in combination with a photo diode 518 converts the electrical signal to a modulated optical signal to be launched into the fiber link. Driver amplifier 514 is a wideband high gain amplifier of the type described above. It is to be understood that the block diagram shown in FIG. 5 is simplified and is for illustrative purposes. The transmitter/receiver may include other circuitry performing other functions such as filtering, automatic gain control, and the like.

In conclusion, the present invention provides methods and circuitry for implementing monolithic high gain wideband amplifiers. The wideband amplifier includes a limiter that also performs a signal splitting function to drive a combiner (i.e., double) distributed amplifier. In a specific embodiment, the limiter is designed to make available two in-phase outputs that are then used to drive the two gate input lines of the combiner distributed amplifier. While the above provides detailed description of specific embodiments, it is to be understood that various alternatives, equivalents and modifications are possible. Therefore, the scope of the invention should not be limited to the embodiments described, and should instead be determined by the following claims and their full breadth of equivalents.

What is claimed is:

1. An amplifier circuit comprising:
    a limiter preamplifier including:
        a differential amplifier coupled to receive a differential input signal at its inputs, and configured to generate a differential output signal made up of a first output signal and a second output signal, and
        an output state having a first differential output amplifier coupled to the first output signal and a second differential output amplifier coupled to the second output signal; and
    a combiner distributed amplifier having a first input coupled to a first output of the first differential output amplifier, and a second input coupled to a first output of the second differential output amplifier,
    wherein the output of the first differential output amplifier and the output of the second differential output amplifier are of the same phase.

2. The amplifier circuit of claim 1 further comprising:
    a first level shift circuit coupled between the first output of the first differential output amplifier and the first input of the combiner distributed amplifier; and
    a second level shift circuit coupled between the first output of the second differential output amplifier and the second input of the combiner distributed amplifier.

3. The amplifier circuit of claim 2 wherein the differential amplifier of the limiter preamplifier comprises a plurality of serially-coupled differential amplifier cells configured to amplify and limit a level of the differential input signal.

4. The amplifier circuit of claim 3 wherein each of the first and second level shift circuitry corn rises a plurality of serially-coupled diodes.

5. The amplifier circuit of claim 1 wherein the first differential output amplifier comp as a first input coupled to the first output signal, a second input that is resistively terminated, and a second output that is 180 degrees out of phase with respect to the first output of the firs differential output amplifier, the second output being resistively terminated.

6. The amplifier circuit of claim 5 wherein the second differential output amplifier comp es a first input coupled to the second output signal, a second input that is resistively terminated, and a second output that is 180 degrees out of phase with respect to the first output of the second differential output amplifier, the second output being resistively terminated.

7. The amplifier circuit of claim 1 wherein the differential amplifier comprises:
    a differential input age having first and second inputs coupled to receive the differential input signal; and a buffer output stag coupled to the differential input stage and configured to shift a signal level at an output of the differential input stage.

8. The amplifier circuit of claim 7 wherein the buffer output stage in the differential amplifier comprises:
   a first source-follow or transistor coupled at a first output of the differential input stage;
   a plurality of serially-coupled diodes coupled between a source terminal of the first source-follower transistor and the first output signal;
   a second source-follower transistor coupled at a second output of the differential input stage; and
   a plurality of serially-coupled diodes coupled between a source terminal of the second source-follower transistor and the second output signal.

9. The amplifier circuit of claim 1 wherein each of the first and the second differential output amplifiers comprises:
   a first field-effect transistor having a gate terminal forming a first input node, a drain terminal forming a first output node, and a source terminal coupled to a common source node;
   a second field-effect transistor having a gate terminal forming a second input node, a drain terminal forming a second output node, and a source terminal coupled to the common source node;
   a first load device coupled between the first output node and a high power supply;
   a second load device coupled between the second output node and the high power supply; and
   a current-source device coupled between the common source node and a low power supply.

10. The amplifier circuit of claim 9 wherein each of the first and the second load device comprises a resistor coupled in series to an inductor.

11. The amplifier circuit of claim 9 wherein the first output node in each of the first and second differential amplifiers is a non-inverting node, and the second output node is an invention node.

12. The amplifier circuit of claim 11 wherein the first input of the combiner distributed amplifier couples to the non-inverting node of the first differential output amplifier, and the second input of the combiner distributed amplifier couples to the inverting node of the second differential output amplifier.

13. The amplifier circuit of claim 12 wherein the load device coupled to the non-inverting node of the first differential output amplifier comprises a resistor coupled to an inductor, while the load device coupled to the inverting node of the first differential output amplifier is eliminated providing for a short between the inverting node of the first differential output amplifier and the high power supply.

14. The amplifier circuit of claim 12 wherein the load device coupled to the inverting node of the second differential output amplifier comprises a resistor coupled to an inductor, while the load device coupled to the non-inverting node of the second differential output amplifier is eliminated providing for a short between the non-inverting node of the second differential output amplifier and the high power supply.

15. The amplifier circuit of claim 1 wherein the combiner distributed amplifier comprises:
   a first plurality of transistor amplifier cells coupled in cascade having a common gate line coupled the first input of the combiner distributed amplifier, and a common drain line coupled to an output of the amplifier circuit; and
   a second plurality of transistor amplifier cells coupled in cascade having a common gate line coupled to the second input of the combiner distributed amplifier, and a common drain line coupled to the output of the amplifier circuit.

16. The amplifier circuit of claim 15 wherein each of the transistor amplifier cells comprises a single common-source field-effect transistor.

17. The amplifier circuit of claim 15 wherein each of the transistor amplifier cello comprises a cascode-coupled pair of field-effect transistors.

18. A method of amplifying a high frequency signal comprising:
   receiving a differential signal at differential inputs of a limiter circuit;
   performing a limiting function on the differential signal;
   using the limiter circuit to amplify the differential signal and to generate a pair of in-phase output signals; and
   applying, respectively, the pair of in-phase output signals to a pair of input terminals of a combiner distributed amplifier.

19. The method of claim 18 further comprising level shifting the pair of in-phase output signal before applying them to the pair of input terminals of the combiner distributed amplifier.

20. A communication system comprising:
   a receiver comprising:
      an optical input circuit coupled to receive an optical signal and to convert the optical signal to an electrical signal,
      a trans-impedance amplifier coupled to receive and amplify the electrical signal,
      a limiter coupled to the trans-impedance amplifier; and
      a demultiplexer coupled to receive an output of the limiter and configured to de-serialize the electrical signal into a plurality of lower frequency parallel signals to be transmitted to a signal processing unit; and
   a transmitter comprising:
      a multiplexer coupled to receive a plurality of parallel signals from the signal processing unit, and configured to serialize the parallel signals into a single differential signal;
      the driver amplifier of claim 1, coupled to receive the differential signal and to generate an output signal; and
      an optical modulator coupled to the driver amplifier and configured to convert the output signal into a modulated optical signal.

21. A limiter amplifier comprising:
   a differential amplifier coupled to receive a differential signal at its inputs and configured to generate a differential output signal made up of a first signal and a second signal;
   an output stage having a first differential output amplifier coupled to receive the first signal and a second differential output amplifier coupled to receive the second signal; and
   a combiner distributed amplifier having a first input coupled to receive the first mingle-ended output signal of the first differential output amplifier, and a second input coupled to receive the second singe-ended output signal of the second differential output amplifier,
   wherein, the first differential output amplifier comprises a first differential pair and is configured to generate a first single-ended output signal and the second differential output amplifier comprises a second differential pair and is configured to generate a second single-ended output signal that is in phase with the first single-ended output signal.

22. An amplifier circuit comprising:

a first differential amplifier having a non-inverting input and an inverting input, and a non-inverting output and an inverting output;

a second differential amplifier having an input coupled to the non-inverting output of the first differential amplifier, and a non-inverting output;

a third differential amplifier having an input coupled to the inverting output of the first differential amplifier, and an veiling output;

a combiner distribute amplifier having a first input coupled to the non-inverting output of the second differential puffer and a second input coupled to the inverting output of the third differential amplifier, wherein the input of the second differential amplifier and the input of the third differential amplifier are the same type of input, and wherein the first duff signal amplifier, the second differential amplifier and the third differential amplifier each comprise a differential pair.

23. The amplifier circuit of claim 22 wherein input of the second differential amplifier and the input of the third differential amplifier are non-inverting inputs.

24. The amplifier circuit of claim 22 wherein input of the second differential amplifier and the input of the third differential amplifier are inverting inputs.

* * * * *